(12) United States Patent
Russell et al.

(10) Patent No.: US 9,875,947 B2
(45) Date of Patent: Jan. 23, 2018

(54) METHOD OF SURFACE PROFILE CORRECTION USING GAS CLUSTER ION BEAM

(71) Applicant: TEL Epion Inc., Billerica, MA (US)

(72) Inventors: Noel Russell, Waterford, NY (US); Soo Doo Chae, Guilderland, NY (US); Vincent Gizzo, East Greenbush, NY (US); Joshua LaRose, Albany, NY (US); Nicholas Joy, Ballston Lake, NY (US)

(73) Assignee: TEL Epion Inc., Billerica, MA (US)

( * ) Notice: Subject to any disclaimer, the term of this patent is extended or adjusted under 35 U.S.C. 154(b) by 26 days.

(21) Appl. No.: 15/142,147

(22) Filed: Apr. 29, 2016

(65) Prior Publication Data

US 2016/0322266 A1  Nov. 3, 2016

Related U.S. Application Data

(60) Provisional application No. 62/155,354, filed on Apr. 30, 2015.

(51) Int. Cl.
*H01L 21/66* (2006.01)
*H01L 21/311* (2006.01)
(Continued)

(52) U.S. Cl.
CPC ........ *H01L 22/20* (2013.01); *H01L 21/28079* (2013.01); *H01L 21/28088* (2013.01);
(Continued)

(58) Field of Classification Search
CPC ...................................................... H01L 43/12
See application file for complete search history.

(56) References Cited

U.S. PATENT DOCUMENTS 7,060,989 B2   6/2006 Swenson et al.
2005/0272237 A1  12/2005 Hautala et al.
(Continued)

FOREIGN PATENT DOCUMENTS

CN       105097536 A    11/2015

OTHER PUBLICATIONS

International Searching Authority, International Search Report and Written Opinion in counter-part International Application No. PCT/US2016/030097, dated Jul. 25, 2016.

*Primary Examiner* — Alexander Ghyka
(74) *Attorney, Agent, or Firm* — Wood Herron & Evans LLP

(57) ABSTRACT

A method for correcting a surface profile on a substrate is described. In particular, the method includes receiving a substrate having a heterogeneous layer composed of a first material and a second material, wherein the heterogeneous layer has an initial upper surface exposing the first material and the second material, and defining a first surface profile across the substrate. The method further includes setting a target surface profile for the heterogeneous layer, selectively removing at least a portion of the first material using a gas cluster ion beam (GCIB) etching process, and recessing the first material beneath the second material, and thereafter, selectively removing at least a portion of the second material to achieve a final upper surface exposing the first material and the second material, and defining a second surface profile, wherein the second surface profile is within a pre-determined tolerance of the target surface profile.

20 Claims, 6 Drawing Sheets

(51) Int. Cl.
*H01L 21/28* (2006.01)
*H01L 21/3105* (2006.01)
*H01L 21/321* (2006.01)
*H01L 21/3213* (2006.01)

(52) U.S. Cl.
CPC .. *H01L 21/31051* (2013.01); *H01L 21/31055* (2013.01); *H01L 21/31116* (2013.01); *H01L 21/32115* (2013.01); *H01L 21/32135* (2013.01); *H01L 22/12* (2013.01)

(56) References Cited

U.S. PATENT DOCUMENTS

| | | |
|---|---|---|
| 2006/0043590 A1 | 3/2006 | Chen et al. |
| 2006/0292762 A1 | 12/2006 | Borland et al. |
| 2010/0072173 A1 | 3/2010 | Hautala |
| 2010/0193472 A1 | 8/2010 | Tabat et al. |
| 2010/0193701 A1 | 8/2010 | Tabat et al. |
| 2016/0071734 A1 | 3/2016 | Graf et al. |

METHOD OF SURFACE PROFILE CORRECTION USING GAS CLUSTER ION BEAM

CROSS-REFERENCE TO RELATED APPLICATIONS

Pursuant to 37 C.F.R. §1.78(a)(4), this application claims the benefit of and priority to prior filed Provisional Application No. 62/155,354 filed Apr. 30, 2015, which is expressly incorporated herein by reference.

FIELD OF THE INVENTION

The invention relates generally to material processing and semiconductor integrated circuit manufacturing and, more specifically but not exclusively, to correction of non-uniformities through location specific processing using gas cluster ion beam (GCIB) technology.

BACKGROUND OF THE INVENTION

Location Specific Processing (LSP) is an automated process that utilizes feed-forward metrology data to create custom correction profiles for each substrate processed. The trimming process includes two steps. Firstly, a map of the film thickness (or patterned feature depth, device parameter, etc.) is used to calculate the corrective parameters, such as mechanical, electrical or optical properties. Secondly, the substrate is processed with the scan speed of the substrate controlled to provide a variable process amount as a function of position on the substrate. Thus, thickness variation, for example, can be reduced with sub-nanometer resolution (in some specific cases, control to within a few angstroms can be achieved) resulting in improved device parametric and/or wafer yield. Location Specific Processing (LSP) Corrective Etch technology is a production proven method to precisely compensate for upstream and downstream processing variations.

In FEOL (Front-End-of-Line) semiconductor processing, metal-containing materials are desirable for use as transistor gate electrodes in future generations of electronic devices. Recently, the preferred methodology for integrating HK/MG (High-k/Metal Gate) is a "gate-last" process and the concern in the gate-last process is its non-uniformity caused by CMP (chemical-mechanical planarization). The metal gate formation can involve some critical CMP steps.

SUMMARY OF THE INVENTION

Embodiments of the invention relate generally to the fields of material processing and semiconductor integrated circuit manufacturing and, more specifically but not exclusively, to correction of non-uniformities through location specific processing using gas cluster ion beam (GCIB) IB technology.

According to one embodiment, a method for correcting a surface profile on a substrate is described. In particular, the method includes receiving a substrate having a heterogeneous layer composed of a first material and a second material, wherein the heterogeneous layer has an initial upper surface exposing the first material and the second material, and defining a first surface profile across the substrate. The method further includes setting a target surface profile for the heterogeneous layer, selectively removing at least a portion of the first material using a gas cluster ion beam (GCIB) etching process, and recessing the first material beneath the second material, and thereafter, selectively removing at least a portion of the second material to achieve a final upper surface exposing the first material and the second material, and defining a second surface profile, wherein the second surface profile is within a pre-determined tolerance of the target surface profile.

According to a further embodiment, the heterogeneous layer comprises a first dielectric material and a second gate electrode material selected from a conductive material and a semi-conductive material, and the initial upper surface defines a spatially non-uniform surface profile across the substrate. The method further includes collecting parametric data relating to the initial upper surface of the substrate, and selectively removing at least a portion of the first dielectric material using a gas cluster ion beam (GCIB) and spatially modulating an applied property of the GCIB, based at least in part on the parametric data, as a function of position on the heterogeneous layer of the substrate to recess the first dielectric material beneath the second gate electrode material. Thereafter, at least a portion of the second gate electrode material is selectively removed to achieve a final upper surface defining a second substantially uniform surface profile.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1A:
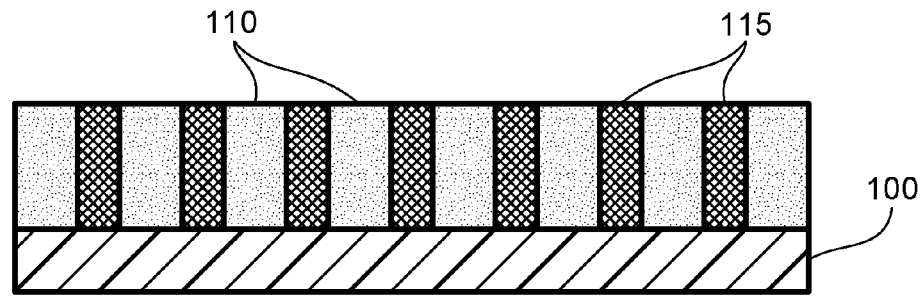
FIGS. 1A through 1D illustrate a schematic representation of a method for planarizing a substrate.

Methods for correcting non-uniformities through location specific processing using gas cluster ion beam (GCIB) technology are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but does not denote that it is present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As noted above in semiconductor manufacturing, when fabricating various complex structures, including transistor gate structures, the fabricator is challenged with manipulating, e.g., etching and depositing, many materials of different types to achieve a desired end result. As further noted, the challenge is enhanced when fabricating high-k metal gates (high dielectric constant dielectric coupled with metal gate electrodes) in a gate-last integration scheme.

Therefore, according to various embodiments, a method for correcting a surface profile on a substrate is described. The method is pictorially illustrated in FIGS. 1A through 1D, and FIGS. 2A and 2B, and presented by way of flow charts 300 and 400 in FIGS. 3 and 4. In 310, a heterogeneous layer 130 composed of a first material and a second material is formed, and one example for forming the heterogeneous layer 130 is illustrated in FIGS. 1A through 1D.

In FIG. 1A, a substrate 100 having a first layer 110 composed of a first material is formed with one or more intermediate features 115 of another material. The upper surface of the first layer 110 with the intermediate features 115 may or may not be planarized. And, if planarization is desired, it may be achieved using one or more embodiments described below. The first material can include a dielectric material, and in some embodiments, it can include a silicon-containing material. For example, the first material can include silicon oxide, silicon nitride, or mixtures thereof, or combinations thereof. When the structure illustrated in FIG. 1A is contemplated as a predecessor to a metal gate structure in a gate-last integration scheme (or replacement metal gate (RMG) scheme), the intermediate features can represent a "dummy gate" composed of silicon, such as polycrystalline silicon (polysilicon).

Figure 1B:
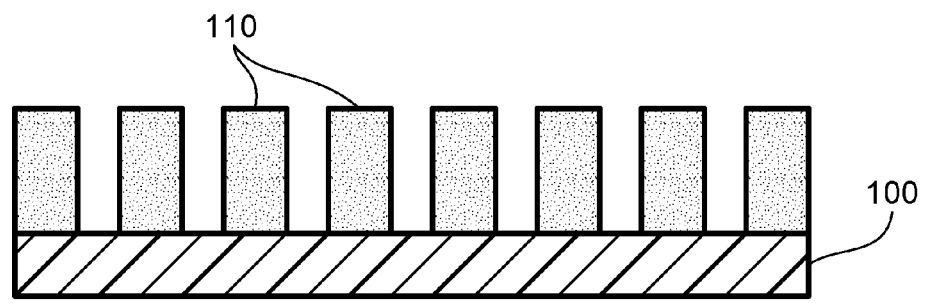
Figure 1C:
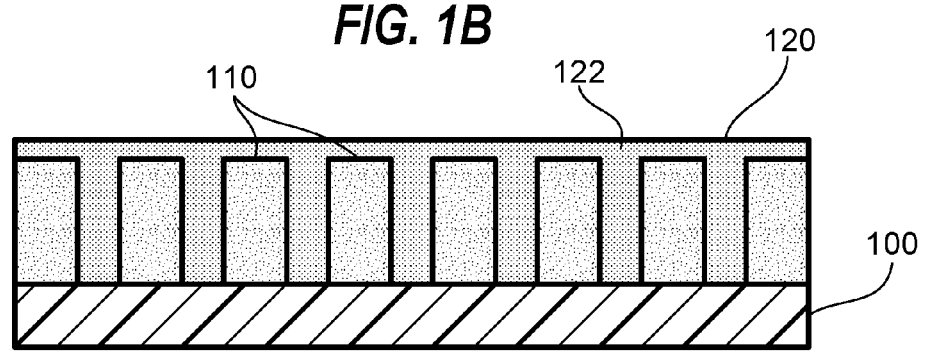

Now, in FIG. 1B, the one or more intermediate features 115 are removed, and in FIG. 1C, are replaced with a second layer 120 composed of a second material. The second material fills the voids left behind by the removal of the one or more intermediate features 115, and forms an over-burden 122.

The second material can include a semi-conductive material or a conductive material, and in some embodiments, it can include a metal-containing material. For example, the second material can be selected from the group consisting of Si, Ge, C, In, Ga, As, P, Sb, W, Al, Ti, Ta, Co, Sc, Y, Zr, Hf, Nb, V, Cr, Mo, Mn, Re, Fe, Co, Rh, Ni, Pd, Pt, Cu, Ag, Au, Zn, Cd, B, Ga, In, and Sn. In one example, the second material can serve as the metal gate electrode in a replacement metal gate (RMG) structure. Furthermore, when filling the voids left behind by the removal of the one or more intermediate features 115, one or more additional layers can be conformally deposited. The one or more additional layers can include a gate dielectric layer, a work function layer, a barrier layer, a seed layer, etc.

The first or second layers 110, 120 may be applied via a spin-on deposition process or a vapor deposition process to conform to the topography of the substrate 100. For example, the first or second layers 110, 120 may be deposited using a chemical vapor deposition (CVD) process, a plasma-enhanced CVD (PECVD) process, an atomic layer deposition (ALD) process, a plasma-enhanced ALD (PEALD) process, a physical vapor deposition (PVD) process, a sputtering process, etc.

Figure 1D:
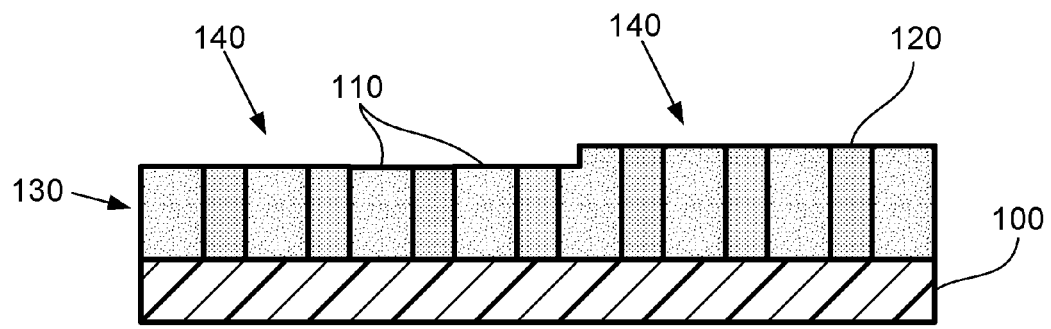

Thereafter, in 320 and as shown in FIG. 1D, the over-burden 122 of the second material is removed to create the heterogeneous layer 130 having an initial upper surface exposing the first material and the second material, and to define a first surface profile 140 across the substrate 100. The removal of the over-burden 122 can be performed using a chemical-mechanical planarization (CMP) process.

Furthermore, as illustrated in FIG. 1D, the resultant surface can be non-uniform. The first surface profile 140 can be a spatially non-uniform surface profile as a result of the chemical-mechanical polishing (CMP) process. In 330, the first surface profile 140 is corrected using, for example, gas cluster ion beam (GCIB) processing.

In a gate-last integration scheme, the sacrificial polysilicon gates are created (FIG. 1A), and after the high-temperature processes for S-D (source-drain) formation and silicide annealing cycles, the dummy gates are removed (see FIG. 1B). The high-k/metal gate electrodes are deposited on the patterns (see FIG. 1C), and planarized by CMP (chemical-mechanical planarization) processing to remove the over-burden (see FIG. 1D).

In a high-k/metal gate process, the second material can be a gate electrode layer, which can include a layer of polycrystalline silicon (polysilicon, or poly-Si) and/or a metal-containing layer. The metal-containing layer can include a metal, a metal alloy, a metal nitride, or a metal oxide, and may contain, for example, titanium, titanium aluminum alloy, tantalum, tantalum aluminum alloy, titanium nitride, titanium silicon nitride, titanium aluminum nitride, tantalum nitride, tantalum silicon nitride, hafnium nitride, hafnium silicon nitride, aluminum nitride, or aluminum oxide. The metal-containing layer may replace or be integrated with a traditional poly-Si gate electrode layer.

The second material can further include a gate dielectric, which can include $SiO_2$, or a high-k (high dielectric constant) layer, and may, for example, include a lanthanum-containing layer, such as lanthanum oxide ($La_2O_3$), or a hafnium containing layer, such as a hafnium oxide layer (e.g., $HfO_x$, $HfO_2$), a hafnium silicate layer (e.g., HfSiO), or a nitrided hafnium silicate (e.g., HfSiO(N)). Additionally, for example, the high-k layer can incorporate metallic silicates or oxides (e.g., $Ta_2O_5$ (k~26), $TiO_2$ (k~80), $ZrO_2$ (k~25), $Al_2O_3$ (k~9)). Furthermore, for example, the high-k layer can include mixed rare earth oxides, mixed rare earth aluminates, mixed rare earth nitrides, mixed rare earth aluminum nitrides, mixed rare earth oxynitrides, or mixed rare earth aluminum oxynitrides. The gate interfacial layer can include a thin layer of silicon dioxide ($SiO_2$) disposed between the high-k layer and the substrate 100.

The substrate 100 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate.

Figure 2A:
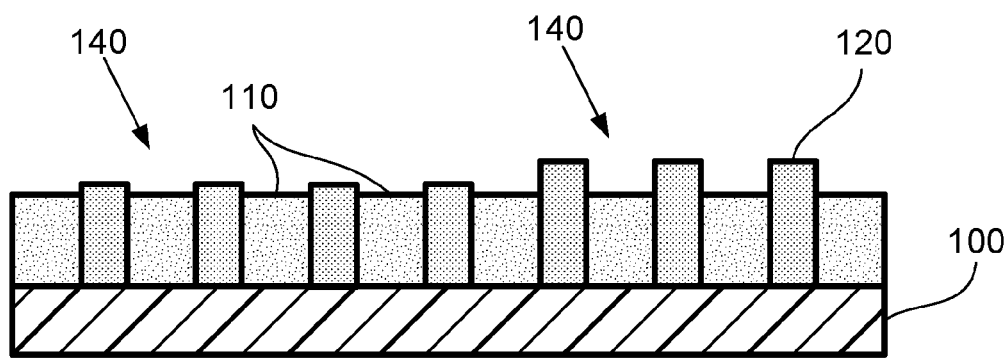
FIGS. 2A and 2B illustrate a schematic representation of a method for correcting a surface profile on a substrate according to an embodiment.
Figure 2B:
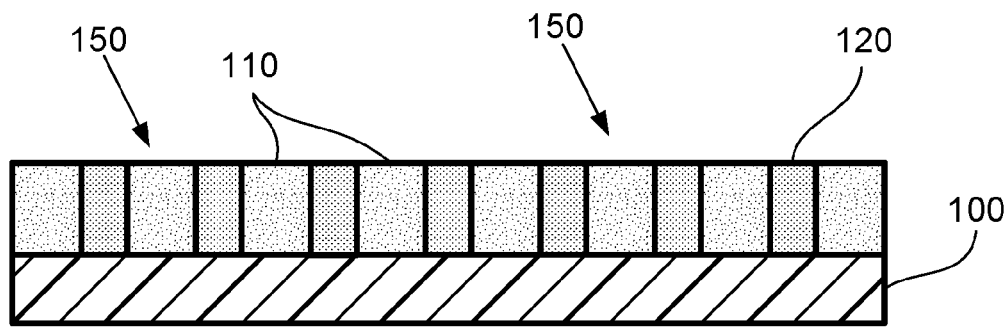
Figure 3:
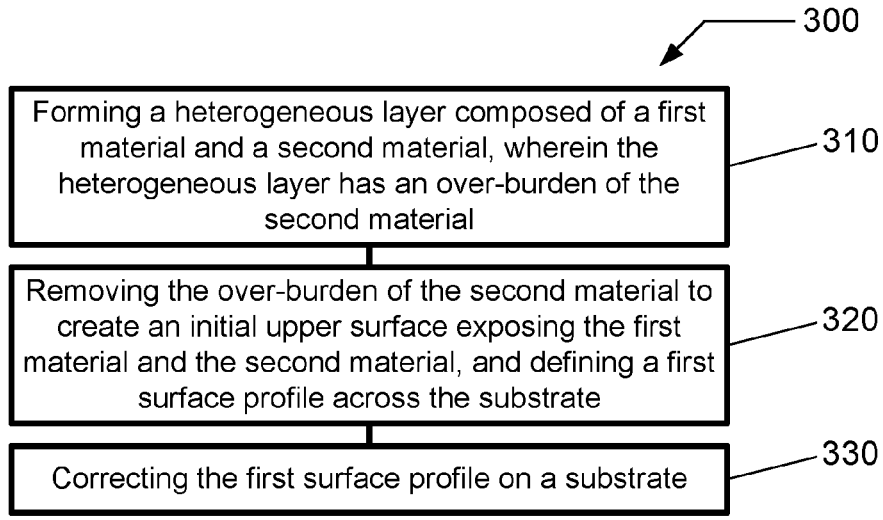
FIG. 3 provides a flow chart illustrating a method for planarizing a substrate according to an embodiment.
Figure 4:
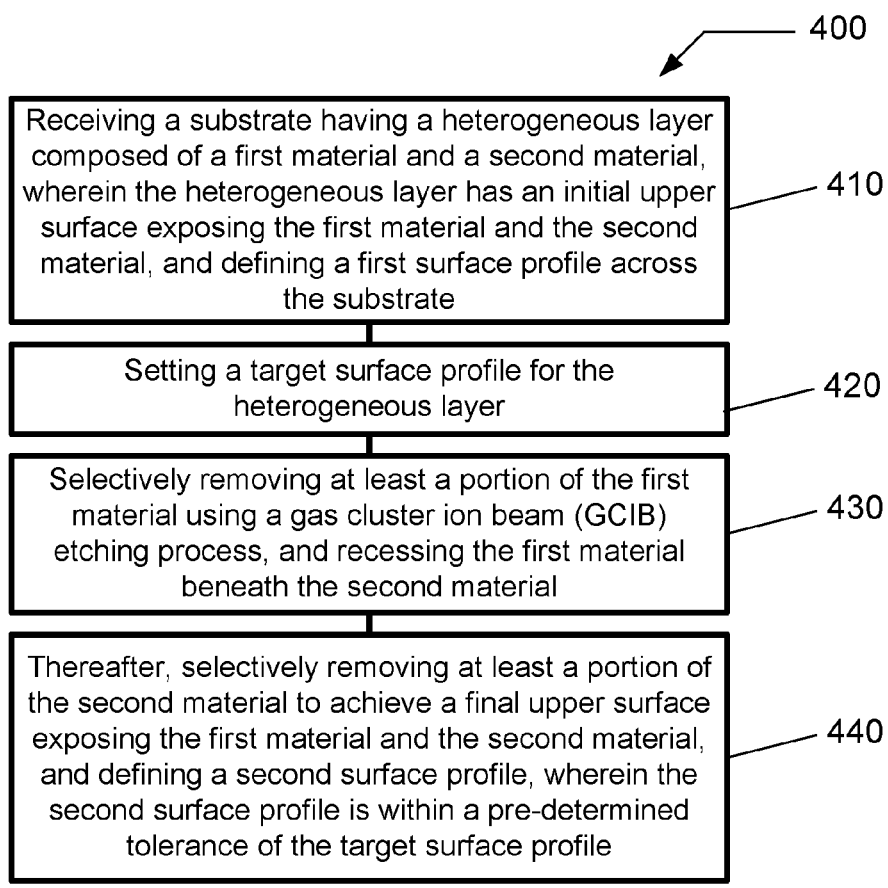
FIG. 4 provides a flow chart illustrating a method for correcting a surface profile on a substrate according to another embodiment.

Referring now to FIGS. 2A and 2B, and flow chart 400 of FIG. 4, a method for correcting a surface profile on a substrate is further described according to an embodiment. In 410, a substrate 100 having heterogeneous layer 130 composed of the first material and the second material is received, wherein the heterogeneous layer 130 has an initial upper surface that exposes the first material and the second material, and defines the first surface profile 140 across the substrate 100, as shown in FIG. 1D.

In 420, a target surface profile for the heterogeneous layer is selected. The target surface profile can include a non-uniform profile, or profile engineered to have a pre-determined non-uniformity. Furthermore, the target surface profile can include a substantially uniform surface profile or substantially planar surface, i.e., a surface profile uniform to within plus or minus 5%, 2%, or 1% within-wafer non-uniformity specification. The within-wafer non-uniformity specification can be measured as the fractional percentage of the standard deviation of the post-processing film thickness (or height) relative to the average value of the post-processing film thickness (or height). Alternatively, statistical measurements of the amount removed from a substrate, or the removal rate can be used. Other metrics for measuring the within-wafer non-uniformity are known to those skilled in the art of material processing and semiconductor device processing.

In 430 and as shown in FIG. 2A, at least a portion of the first material is selectively removed using a gas cluster ion beam (GCIB) etching process, and the first material is recessed beneath the second material. For example, following GCIB processing, an upper surface of the first material is elevationally receded below an upper surface of the second material. Furthermore, the upper surface of the first material can be adjusted to be within a pre-determined tolerance of the target surface profile.

Thereafter, in 440 and as shown in FIG. 2B, at least a portion of the second material is selectively removed that achieves a final upper surface exposing the first material and the second material, and defines a second surface profile 150, wherein the second surface profile 150 is within a pre-determined tolerance of the target surface profile. The pre-determined tolerance can range up to plus or minus 100 nm, 10 nm, 5 nm, 2 nm, 1 nm, 100 Angstroms, or even 10 Angstroms. The selective removal of the second material can be performed using CMP, or an etching process.

As described above, the method includes Location Specific Processing (LSP) with a GCIB etching process to improve surface uniformity. In an example, when preparing a HK/MG structure using a gate-last scheme, the LSP GCIB etching process can be used to improve the uniformity of the first material (e.g., oxide) using a high etch selectivity process condition for the first material to the second material (e.g., oxide-to-metal) (oxide etch is much faster than metal etch). Once the uniformity of the first material is corrected, the method further includes planarizing the patterns using high CMP selectivity of metal:oxide (metal CMP is much faster than oxide CMP).

In one embodiment, the GCIB etching process can include exposing the first material to an etching GCIB. The GCIB etching process can include maintaining a reduced-pressure environment around a substrate holder for holding the substrate 100, and holding the substrate 100 securely within the reduced-pressure environment of a GCIB processing system. The GCIB processing system can include any one of the GCIB processing systems (500, 600, 700) described below in FIG. 5, 6, or 7, or any combination thereof. The temperature of substrate 100 may or may not be controlled. For example, substrate 100 may be heated or cooled during a GCIB modification process.

The GCIB etching process includes forming the etching GCIB from a pressurized gas mixture containing a material suitable for modifying the first material. The etching GCIB is formed by expanding the pressurized gas mixture through at least one nozzle into the GCIB processing system. The primary gas includes a pressurized gas mixture containing at least one atomic specie selected from the group consisting of He, Ne, Ar, Kr, Xe, B, C, H, Si, Ge, N, P, As, O, S, F, Cl, and Br. To form the etching GCIB, constituents of the pressurized gas mixture should be selected that exist in a gaseous phase either alone or in combination with a carrier gas (e.g., a noble gas element or nitrogen) at relatively high pressure (e.g., a pressure of one atmosphere or greater).

In some embodiments, the etching GCIB is formed from a pressurized gas mixture containing a halogen. For example, the pressurized gas mixture can contain a halide, a halomethane, a halosilane, or a halogermane, or any combination thereof.

In other exemplary embodiments of the GCIB etching process, the pressurized gas mixture can include $Cl_2$, $CF_4$, $SiF_4$, $CHF_3$, $SF_6$, $NF_3$, and combinations thereof, when etching silicon-containing materials, silicon oxide, or oxidized silicon nitride. To form the etching GCIB, constituents of the pressurized gas mixture should be selected that exist in a gaseous phase either alone or in combination with a dilution gas, a carrier gas, or an additive gas (e.g., a noble gas element, oxygen, or nitrogen) at relatively high pressure (e.g., a pressure of one atmosphere or greater).

In other embodiments, one or more GCIB properties of a GCIB process condition for the GCIB are set to achieve the one or more target process metrics, such as target etch process metrics. Target etch process metrics can include an etch rate of the first material, an etch rate of the second material, an etch selectivity of the first material relative to the second material, an etch amount or depth within the first material or relative to the second material, spatial variation or uniformity of the etch amount or etch depth, surface planarity of the first material, and an etch surface roughness within the first material, etc.

In one embodiment, the one or more GCIB properties of the GCIB process condition may include a GCIB composition, a beam dose, a beam acceleration potential, a beam focus potential, a beam energy, a beam energy distribution, a beam angular distribution, a beam divergence angle, a flow rate of the GCIB composition, a stagnation pressure, a stagnation temperature, a background gas pressure for an increased pressure region through which the GCIB passes, or a background gas flow rate for an increased pressure region through which the modifying GCIB passes (e.g., a P-Cell value, as will be discussed in greater detail below).

To achieve the target etch process metrics noted above, the etching GCIB may be generated by performing the following: selecting one or more GCIB properties of the GCIB process condition, selecting a beam acceleration potential, one or more beam focus potentials, and a beam dose; accelerating the etching GCIB according to the beam acceleration potential; focusing the etching GCIB according to the one or more beam focus potentials; and irradiating at least a portion of the etching GCIB onto at least a portion of the substrate according to the beam dose.

Furthermore, in addition to these GCIB properties, a mass flow rate, a cluster size, a cluster size distribution, a beam size, or a gas nozzle design (such as nozzle throat diameter, nozzle length, and/or nozzle divergent section half-angle) may be selected. Any one or more of the aforementioned GCIB properties can be selected to achieve control of target etch process metrics, such as those noted above. Furthermore, any one or more of the aforementioned GCIB properties can be modified to achieve control of target etch process metrics, such as those noted above.

As described above, the beam energy distribution function for the modifying GCIB may be modified by directing the respective modifying GCIB along a GCIB path through an increased pressure region such that at least a portion of the modifying GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the etching GCIB may be modified by modifying or altering a charge state of the respective etching GCIB. For example, the charge state may be modified by adjusting an electron flux, an electron energy, or an electron energy distribution for electrons utilized in electron collision-induced ionization of gas clusters.

In another embodiment, the directionality of the etching GCIB relative to normal incidence on the substrate may be adjusted by altering the beam angular distribution function. The beam angular distribution function or beam divergence angle may be modified using the aforementioned techniques described for modifying the beam energy distribution function.

During irradiation, the etching GCIB is accelerated through the reduced pressure environment towards substrate according to a beam acceleration potential. For the GCIB, the beam acceleration potential may range up to 100 kV, the beam energy may range up to 100 keV, the cluster size may range up to several tens of thousands of atoms, and the beam dose may range up to about $1 \times 10^{17}$ clusters per $cm^2$. For example, the beam acceleration potential of the GCIB may range from about 1 kV to about 70 kV (i.e., the beam energy may range from about 1 keV to about 70 keV, assuming an average cluster charge state of unity). Additionally, for example, the beam dose of the GCIB may range from about $1 \times 10^{12}$ clusters per $cm^2$ to about $1 \times 10^{14}$ clusters per $cm^2$.

The GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

In other embodiments, the method described above may further include altering the one or more target process metrics to create one or more new target process metrics, and setting one or more additional GCIB properties of an additional GCIB process condition for the GCIB to achieve the one or more new target process metrics.

In yet other embodiments, the method describe above can include providing a secondary gas source that is arranged to deliver a secondary gas into the GCIB processing system, in addition to the etching GCIB. For example, the secondary gas source can introduce a secondary gas, vapor, or mixture thereof to enhance or improve the GCIB etching process.

The selective removal of the first process can be achieved using the GCIB etching process, wherein the GCIB etching process can achieve an etch selectivity between the first material and the second material that exceeds 2-to-1. Alternatively, the GCIB etching process can achieve an etch selectivity between the first material and the second material that exceeds 3-to-1. Alternatively, the GCIB etching process can achieve an etch selectivity between the first material and the second material that exceeds 5-to-1. Alternatively, the GCIB etching process can achieve an etch selectivity between the first material and the second material that exceeds 10-to-1.

In another embodiment, when selectively removing at least a portion of the first material, the surface of the first material and/or the composition of the first material can be modified. The modification process can include a GCIB modification process, and can include, for example, a GCIB oxidation process, wherein the pressurized gas mixture includes an oxygen-containing gas. The pressurized gas mixture can further include or alternatively include a nitrogen-containing gas, or a noble element, or any combination thereof. For example, the pressurized gas mixture can include He, Ne, Ar, Kr, Xe, $O_2$, CO, $CO_2$, $N_2$, NO, $NO_2$, $N_2O$, $NH_3$, or any mixture thereof.

In another embodiment, GCIB etching and modifying may be generated by alternatingly and sequentially using a first pressurized gas mixture containing a modification gas and a second pressurized gas mixture containing an etching gas. In yet other embodiments, a composition and/or a stagnation pressure of the modifying GCIB may be adjusted during the modifying and/or etching.

In another embodiment, the modifying and selective removing can be repeated multiple cycles, e.g., two or more cycles until the first material is sufficiently recessed beneath the second material.

According to another embodiment, the at least one portion of substrate subjected to etching GCIB irradiation may be cleaned before or after the irradiating with the etching GCIB. For example, the cleaning process may include a dry cleaning process and/or a wet cleaning process. Additionally, the at least one portion of substrate subjected to GCIB irradiation may be annealed after the irradiating with the GCIB.

During Location Specific Processing (LSP), the substrate is processed with the scan speed of the substrate controlled to provide a variable process amount as a function of position on the substrate. Therefore, when performing a GCIB etching process, as noted above, any portion of the substrate can be subjected to corrective, LSP processing. During corrective, LSP processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using the etching GCIB. During corrective processing, the GCIB may further be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

One or more of the methods for performing a surface profile adjustment process sequence according to various embodiments described above may be performed in any one of the GCIB processing systems illustrated in FIGS. 5 through 7 and described below. GCIB processing systems 500, 600, 700 may be used to etch, grow, deposit, dope, modify, or smooth layers or structures on the substrate.

Therefore, according to various embodiments, systems and methods for treating a substrate with a GCIB are described. Referring now to the drawings wherein like reference numerals designate corresponding parts throughout the several views, FIG. 5 provides a schematic illustration of a GCIB processing system 500 for treating a substrate according to an embodiment. The GCIB processing system 500 comprises a vacuum vessel 502, substrate holder 550, upon which a substrate 552 to be processed is affixed, and vacuum pumping systems 570A, 570B, and 570C. Substrate 552 can be a semiconductor substrate, a wafer, a flat panel display (FPD), a liquid crystal display (LCD), or any other workpiece. GCIB processing system 500 is configured to produce a GCIB for treating substrate 552.

Figure 5:
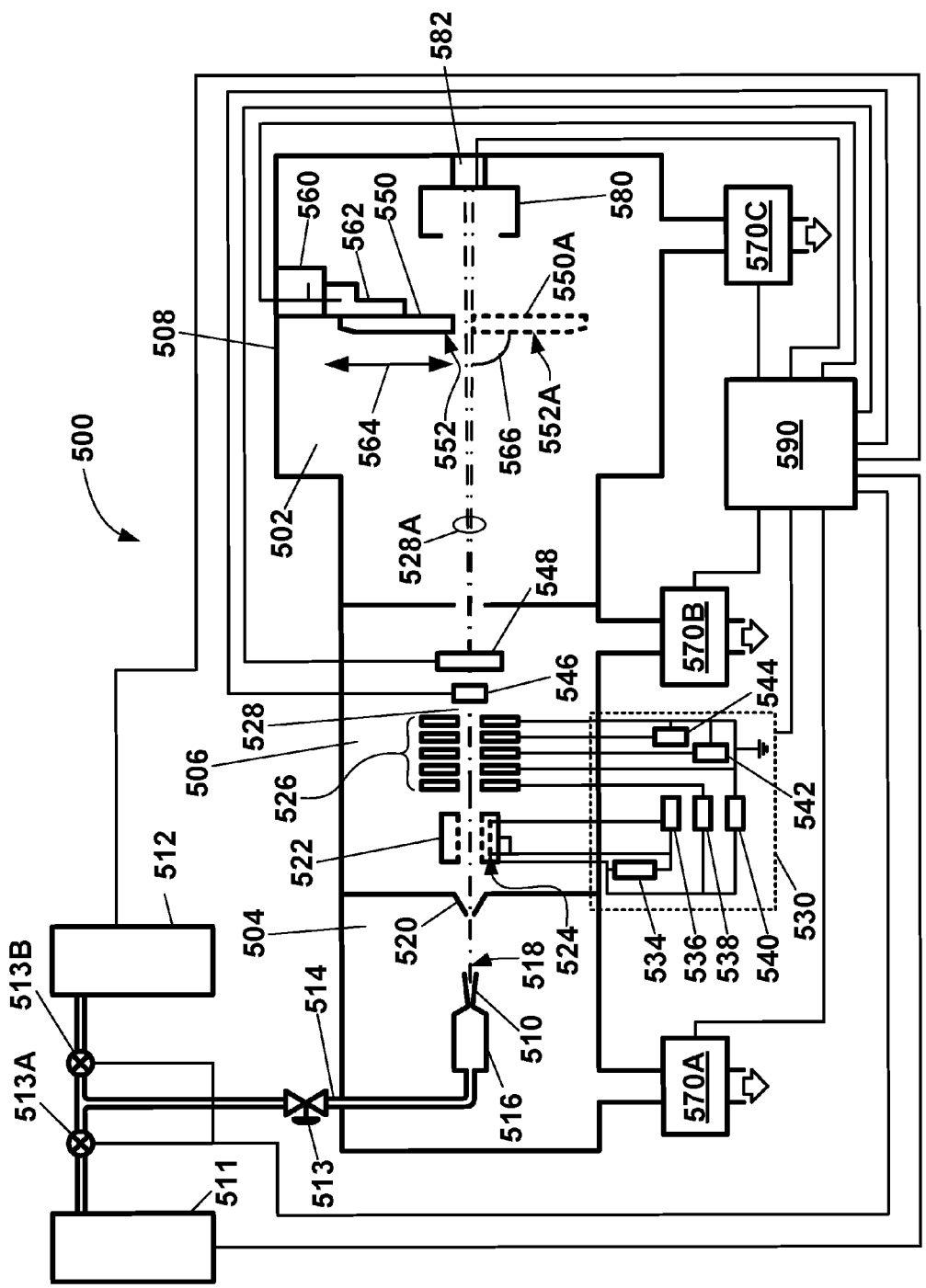
FIG. 5 is an illustration of a GCIB processing system.

Referring still to GCIB processing system 500 in FIG. 5, the vacuum vessel 502 comprises three communicating chambers, namely, a source chamber 504, an ionization/acceleration chamber 506, and a processing chamber 508 to provide a reduced-pressure enclosure. The three chambers are evacuated to suitable operating pressures by vacuum pumping systems 570A, 570B, and 570C, respectively. In the three communicating chambers 504, 506, 508, a gas cluster beam can be formed in the first chamber (source chamber 504), while a GCIB can be formed in the second chamber (ionization/acceleration chamber 506) wherein the gas cluster beam is ionized and accelerated. Then, in the third chamber (processing chamber 508), the accelerated GCIB may be utilized to treat substrate 552.

As shown in FIG. 5, GCIB processing system 500 can comprise one or more gas sources configured to introduce one or more gases or mixture of gases to vacuum vessel 502. For example, a first gas composition stored in a first gas source 511 is admitted under pressure through a first gas control valve 513A to a gas metering valve or valves 513. Additionally, for example, a second gas composition stored in a second gas source 512 is admitted under pressure through a second gas control valve 513B to the gas metering valve or valves 513. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 511 and the second gas source 512 may be utilized either alone or in combination with one another to produce ionized clusters. The material composition can include the principal atomic or molecular species of the elements desired to react with or be introduced to the material layer.

The high pressure, condensable gas comprising the first gas composition or the second gas composition or both is introduced through gas feed tube 514 into stagnation chamber 516 and is ejected into the substantially lower pressure vacuum through a properly shaped nozzle 510. As a result of the expansion of the high pressure, condensable gas from the stagnation chamber 516 to the lower pressure region of the source chamber 504, the gas velocity accelerates to supersonic speeds and gas cluster beam 518 emanates from nozzle 510.

The inherent cooling of the jet as static enthalpy is exchanged for kinetic energy, which results from the expansion in the jet, causes a portion of the gas jet to condense and form a gas cluster beam 518 having clusters, each consisting of from several to several thousand weakly bound atoms or molecules. A gas skimmer 520, positioned downstream from the exit of the nozzle 510 between the source chamber 504 and ionization/acceleration chamber 506, partially separates the gas molecules on the peripheral edge of the gas cluster beam 518, that may not have condensed into a cluster, from the gas molecules in the core of the gas cluster beam 518, that may have formed clusters. Among other reasons, this selection of a portion of gas cluster beam 518 can lead to a reduction in the pressure in the downstream regions where higher pressures may be detrimental (e.g., ionizer 522, and processing chamber 508). Furthermore, gas skimmer 520 defines an initial dimension for the gas cluster beam entering the ionization/acceleration chamber 506.

The GCIB processing system 500 may also include multiple nozzles with one or more skimmer openings. Additional details concerning the design of a multiple gas cluster ion beam system are provided in U.S. Patent Application Publication No. 2010/0193701A1, entitled "Multiple Nozzle Gas Cluster Ion Beam System" and filed on Apr. 23, 2009; and U.S. Patent Application Publication No. 2010/0193472A1, entitled "Multiple Nozzle Gas Cluster Ion Beam Processing System and Method of Operating" and filed on Mar. 26, 2010; the contents of which are herein incorporated by reference in their entirety.

After the gas cluster beam 518 has been formed in the source chamber 504, the constituent gas clusters in gas cluster beam 518 are ionized by ionizer 522 to form GCIB 528. The ionizer 522 may include an electron impact ionizer that produces electrons from one or more filaments 524, which are accelerated and directed to collide with the gas clusters in the gas cluster beam 518 inside the ionization/acceleration chamber 506. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 530 are utilized to ionize, extract, accelerate, and focus the GCIB 528. The beam electronics 530 include a filament power supply 536 that provides voltage $V_F$ to heat the ionizer filament 524.

Additionally, the beam electronics 530 include a set of suitably biased high voltage electrodes 526 in the ionization/acceleration chamber 506 that extracts the cluster ions from the ionizer 522. The high voltage electrodes 526 then accelerate the extracted cluster ions to a desired energy and focus them to define GCIB 528. The kinetic energy of the cluster ions in GCIB 528 typically ranges from about 1000 electron volts (1 keV) to several tens of keV. For example, GCIB 528 can be accelerated to 1 to 100 keV.

As illustrated in FIG. 5, the beam electronics 530 further include an anode power supply 534 that provides voltage $V_A$ to an anode of ionizer 522 for accelerating electrons emitted from ionizer filament 524 and causing the electrons to bombard the gas clusters in gas cluster beam 518, which produces cluster ions.

Additionally, as illustrated in FIG. 5, the beam electronics 530 include an extraction power supply 538 that provides voltage $V_{EE}$ to bias at least one of the high voltage electrodes 526 to extract ions from the ionizing region of ionizer 522 and to form the GCIB 528. For example, extraction power supply 538 provides a voltage to a first electrode of the high voltage electrodes 526 that is less than or equal to the anode voltage of ionizer 522.

Furthermore, the beam electronics 530 can include an accelerator power supply 540 that provides voltage $V_{ACC}$ to bias one of the high voltage electrodes 526 with respect to the ionizer 522 so as to result in a total GCIB acceleration energy equal to about $V_{ACC}$ electron volts (eV). For example, accelerator power supply 540 provides a voltage to a second electrode of the high voltage electrodes 526 that is less than or equal to the anode voltage of ionizer 522 and the extraction voltage of the first electrode.

Further yet, the beam electronics 530 can include lens power supplies 542, 544 that may be provided to bias some of the high voltage electrodes 526 with potentials (e.g., $V_{L1}$ and $V_{L2}$) to focus the GCIB 528. For example, lens power supply 542 can provide a voltage to a third electrode of the high voltage electrodes 526 that is less than or equal to the anode voltage of ionizer 522, the extraction voltage of the first electrode, and the accelerator voltage of the second electrode, and lens power supply 544 can provide a voltage to a fourth electrode of the high voltage electrodes 526 that is less than or equal to the anode voltage of ionizer 522, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 546 in the ionization/acceleration chamber 506 downstream of the high voltage electrodes 526 can be utilized to eliminate monomers, or monomers and light cluster ions from the GCIB 528 to define a filtered process GCIB 528A that enters the processing chamber 508. In one embodiment, the beam filter 546 substantially reduces the number of clusters having 100 or less atoms or molecules or both. The beam filter may comprise a magnet assembly for imposing a magnetic field across the GCIB 528 to aid in the filtering process.

Referring still to FIG. 5, a beam gate 548 is disposed in the path of GCIB 528 in the ionization/acceleration chamber 106. Beam gate 548 has an open state in which the GCIB 528 is permitted to pass from the ionization/acceleration chamber 506 to the processing chamber 508 to define process GCIB 528A, and a closed state in which the GCIB 528 is blocked from entering the processing chamber 508. A control cable conducts control signals from control system 590 to beam gate 548. The control signals controllably switch beam gate 548 between the open or closed states.

A substrate 552, which may be a wafer or semiconductor wafer, a flat panel display (FPD), a liquid crystal display (LCD), or other substrate to be processed by GCIB processing, is disposed in the path of the process GCIB 528A in the processing chamber 508. Because most applications contemplate the processing of large substrates with spatially uniform results, a scanning system may be desirable to uniformly scan the process GCIB 528A across large areas to produce spatially homogeneous results.

An X-scan actuator 560 provides linear motion of the substrate holder 550 in the direction of X-scan motion (into and out of the plane of the paper). A Y-scan actuator 562 provides linear motion of the substrate holder 550 in the direction of Y-scan motion 564, which is typically orthogonal to the X-scan motion. The combination of X-scanning and Y-scanning motions translates the substrate 552, held by the substrate holder 550, in a raster-like scanning motion through process GCIB 528A to cause a uniform (or otherwise programmed) irradiation of a surface of the substrate 552 by the process GCIB 528A for processing of the substrate 552.

The substrate holder 550 disposes the substrate 552 at an angle with respect to the axis of the process GCIB 528A so that the process GCIB 528A has an angle of beam incidence 566 with respect to a substrate 552 surface. The angle of beam incidence 566 may be 90 degrees or some other angle, but is typically 90 degrees or near 90 degrees. During Y-scanning, the substrate 552 and the substrate holder 550 move from the shown position to the alternate position "A" indicated by the designators 552A and 550A, respectively. Notice that in moving between the two positions, the substrate 552 is scanned through the process GCIB 528A, and in both extreme positions, is moved completely out of the path of the process GCIB 528A (over-scanned). Though not shown explicitly in FIG. 5, similar scanning and over-scan is performed in the (typically) orthogonal X-scan motion direction (in and out of the plane of the paper).

A beam current sensor 580 may be disposed beyond the substrate holder 550 in the path of the process GCIB 528A so as to intercept a sample of the process GCIB 528A when the substrate holder 550 is scanned out of the path of the process GCIB 528A. The beam current sensor 580 is typically a Faraday cup or the like, closed except for a beam-entry opening, and is typically affixed to the wall of the vacuum vessel 502 with an electrically insulating mount 582.

As shown in FIG. 5, control system 590 connects to the X-scan actuator 560 and the Y-scan actuator 562 through electrical cable and controls the X-scan actuator 560 and the Y-scan actuator 562 in order to place the substrate 552 into or out of the process GCIB 528A and to scan the substrate 552 uniformly relative to the process GCIB 528A to achieve desired processing of the substrate 552 by the process GCIB 528A. Control system 590 receives the sampled beam current collected by the beam current sensor 580 by way of an electrical cable and, thereby, monitors the GCIB and controls the GCIB dose received by the substrate 552 by removing the substrate 552 from the process GCIB 528A when a predetermined dose has been delivered.

Figure 6:
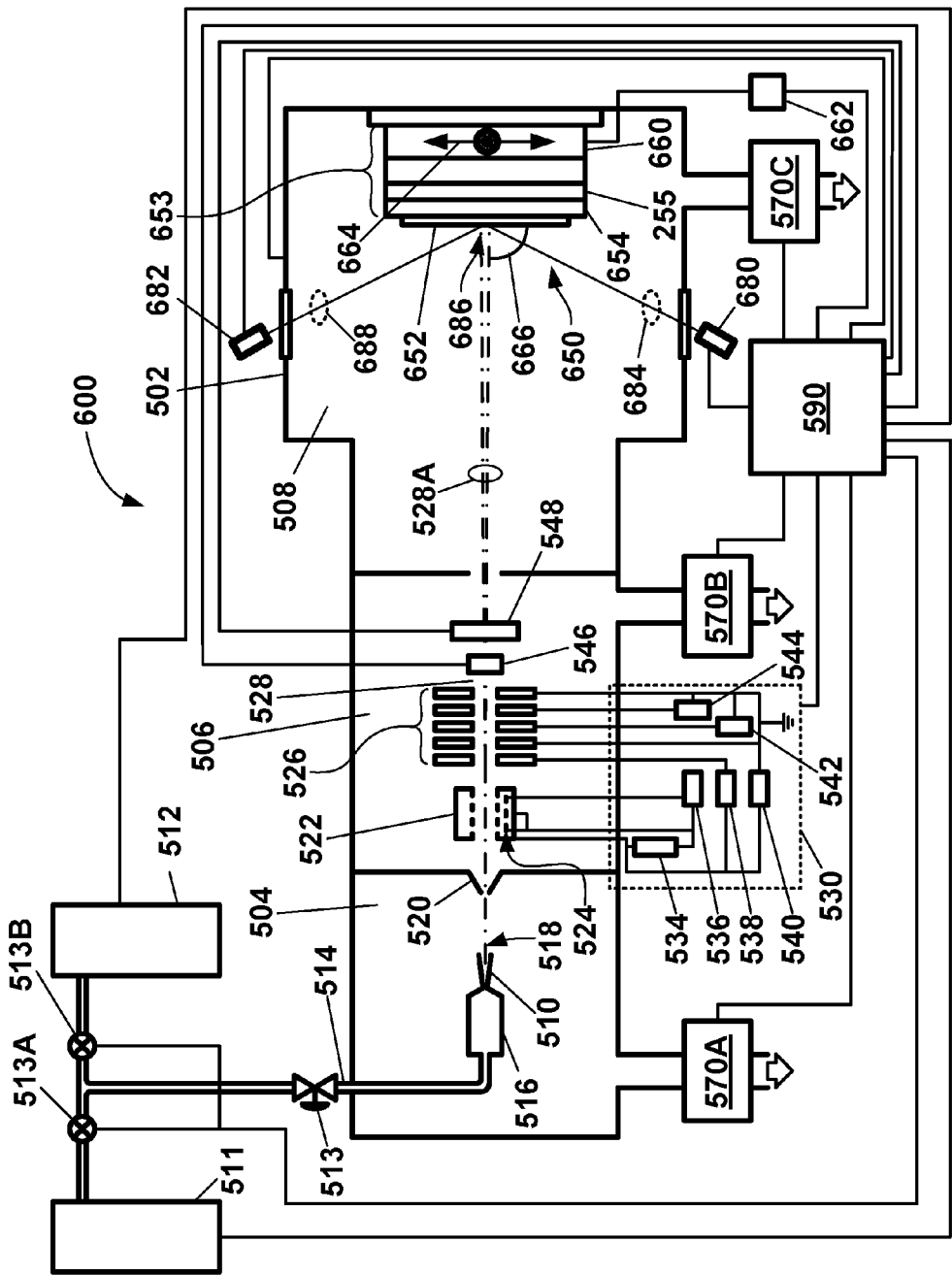
FIG. 6 is another illustration of a GCIB processing system.

In the embodiment shown in FIG. 6, the GCIB processing system 600 can be similar to the embodiment of FIG. 5 and further comprise a X-Y positioning table 653 operable to hold and move a substrate 652 in two axes, effectively scanning the substrate 652 relative to the process GCIB 528A. For example, the X-motion can include motion into and out of the plane of the paper, and the Y-motion can include motion along direction 664.

The process GCIB 528A impacts the substrate 652 at a projected impact region 686 on a surface of the substrate 652, and at an angle of beam incidence 666 with respect to the surface of substrate 652. By X-Y motion, the X-Y positioning table 653 can position each portion of a surface of the substrate 652 in the path of process GCIB 528A so that every region of the surface may be made to coincide with the projected impact region 686 for processing by the process GCIB 528A. An X-Y controller 662 provides electrical signals to the X-Y positioning table 653 through an electrical cable for controlling the position and velocity in each of X-axis and Y-axis directions. The X-Y controller 662 receives control signals from, and is operable by, control system 590 through an electrical cable. X-Y positioning table 653 moves by continuous motion or by stepwise motion according to conventional X-Y table positioning technology to position different regions of the substrate 652 within the projected impact region 686. In one embodiment, X-Y positioning table 653 is programmably operable by the control system 590 to scan, with programmable velocity, any portion of the substrate 652 through the projected impact region 686 for GCIB processing by the process GCIB 528A.

The substrate holding surface 654 of positioning table 653 is electrically conductive and is connected to a dosimetry processor operated by control system 590. An electrically insulating layer 655 of positioning table 653 isolates the substrate 652 and substrate holding surface 654 from the base portion 660 of the positioning table 653. Electrical charge induced in the substrate 652 by the impinging process GCIB 528A is conducted through substrate 652 and substrate holding surface 654, and a signal is coupled through the positioning table 653 to control system 590 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 528A. In such case, a Faraday cup (not shown, but which may be similar to beam current sensor 580 in FIG. 5) may be used to assure accurate dosimetry despite the added source of electrical charge, the reason being that typical Faraday cups allow only the high energy positive ions to enter and be measured.

In operation, the control system 590 signals the opening of the beam gate 548 to irradiate the substrate 652 with the process GCIB 528A. The control system 590 monitors measurements of the GCIB current collected by the substrate 652 in order to compute the accumulated dose received by the substrate 652. When the dose received by the substrate 652 reaches a predetermined dose, the control system 190 closes the beam gate 548 and processing of the substrate 652 is complete. Based upon measurements of the GCIB dose received for a given area of the substrate 652, the control system 590 can adjust the scan velocity in order to achieve an appropriate beam dwell time to treat different regions of the substrate 652.

Alternatively, the process GCIB 528A may be scanned at a constant velocity in a fixed pattern across the surface of the substrate 652; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 522 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 508 may further include an in-situ metrology system. For example, the in-situ metrology system may include an optical diagnostic system having an optical transmitter 680 and optical receiver 682 configured to illuminate substrate 652 with an incident optical signal 684 and to receive a scattered optical signal 688 from substrate 652, respectively. The optical diagnostic system comprises optical windows to permit the passage of the incident optical signal 684 and the scattered optical signal 688 into and out of the processing chamber 508. Furthermore, the optical transmitter 680 and the optical receiver 682 may comprise transmitting and receiving optics, respectively. The optical transmitter 680 receives, and is responsive to, controlling electrical signals from the control system 590. The optical receiver 682 returns measurement signals to the control system 590.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 600. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 653 via control signals from control system 590, the in-situ metrology system can map one or more characteristics of the substrate 652.

Figure 7:
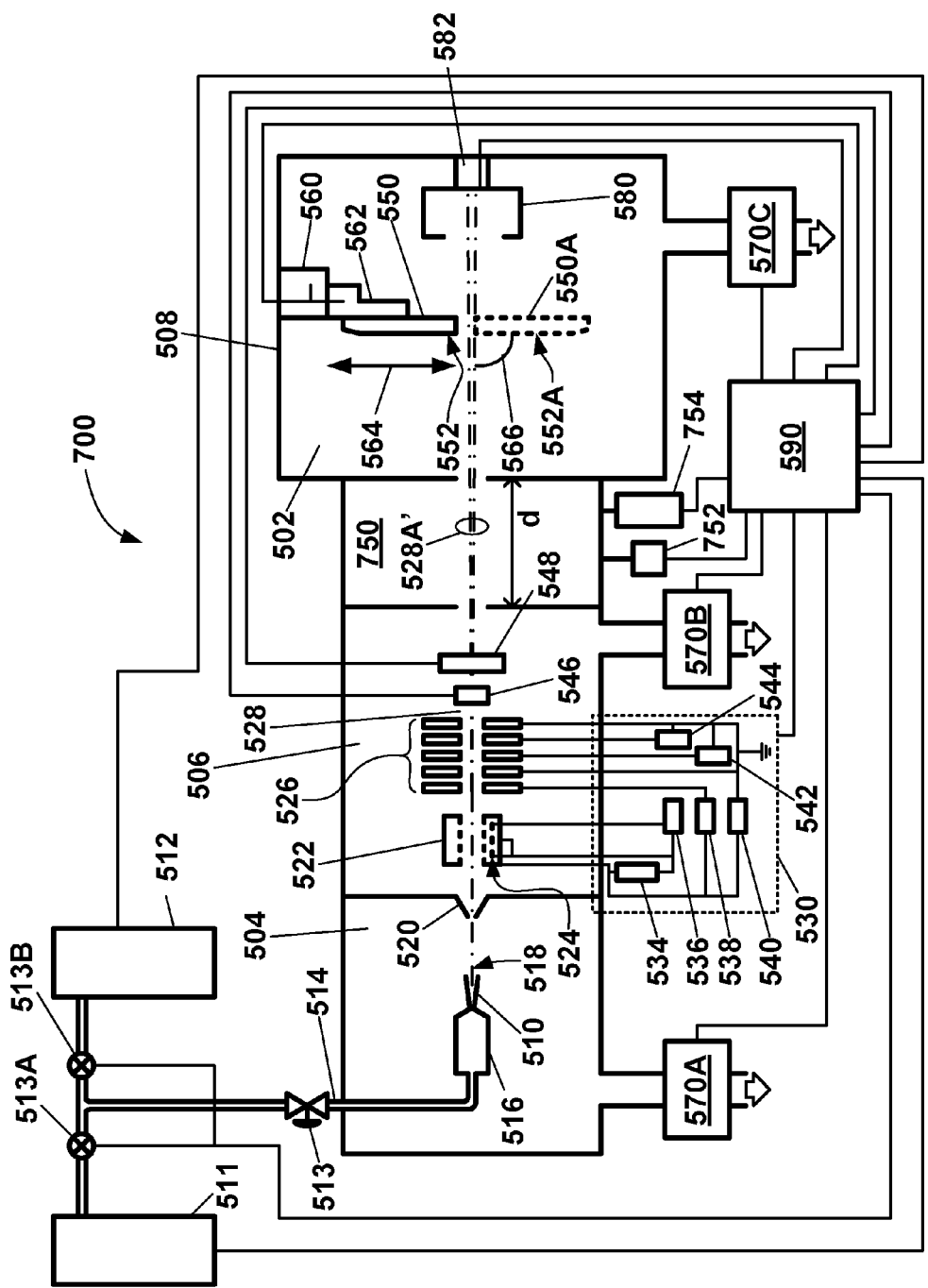
FIG. 7 is yet another illustration of a GCIB processing system.

In the embodiment shown in FIG. 7, the GCIB processing system 700 can be similar to the embodiment of FIG. 5 and further comprise a pressure cell chamber 750 positioned, for example, at or near an outlet region of the ionization/acceleration chamber 506. The pressure cell chamber 750 comprises an inert gas source 752 configured to supply a background gas to the pressure cell chamber 750 for elevating the pressure in the pressure cell chamber 750, and a pressure sensor 754 configured to measure the elevated pressure in the pressure cell chamber 750.

The pressure cell chamber 750 may be configured to modify the beam energy distribution of GCIB 528 to produce a modified processing GCIB 528A'. This modification of the beam energy distribution is achieved by directing GCIB 528 along a GCIB path through an increased pressure region within the pressure cell chamber 750 such that at least a portion of the GCIB traverses the increased pressure region. The extent of modification to the beam energy distribution may be characterized by a pressure-distance integral along the at least a portion of the GCIB path, where distance (or length of the pressure cell chamber 750) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 590 comprises a microprocessor, memory, and a digital I/O port capable of generating control voltages sufficient to communicate and activate inputs to GCIB processing system 500 (or 600, 700), as well as monitor outputs from GCIB processing system 500 (or 600, 700). Moreover, control system 590 can be coupled to and can exchange information with vacuum pumping systems 570A, 570B, and 570C, first gas source 511, second gas source 512, first gas control valve 513A, second gas control valve 513B, beam electronics 530, beam filter 546, beam gate 548, the X-scan actuator 160, the Y-scan actuator 562, and beam current sensor 580. For example, a program stored in the memory can be utilized to activate the inputs to the aforementioned components of GCIB processing system 500 according to a process recipe in order to perform a GCIB process on substrate 552.

However, the control system 590 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 590 can be used to configure any number of processing elements, as described above, and the control system 590 can collect, provide, process, store, and display data from processing elements. The control system 590 can include a number of applications, as well as a number of controllers, for controlling one or more of the processing elements. For example, control system 590 can include a graphic user interface (GUI) component (not shown) that can provide interfaces that enable a user to monitor and/or control one or more processing elements.

Control system 590 can be locally located relative to the GCIB processing system 500 (or 600, 700), or it can be remotely located relative to the GCIB processing system 500 (or 600, 700). For example, control system 590 can exchange data with GCIB processing system 500 using a direct connection, an intranet, and/or the Internet. Control system 590 can be coupled to an intranet at, for example, a customer site (i.e., a device maker, etc.), or it can be coupled to an intranet at, for example, a vendor site (i.e., an equipment manufacturer). Alternatively or additionally, control system 590 can be coupled to the Internet. Furthermore, another computer (i.e., controller, server, etc.) can access control system 590 to exchange data via a direct connection, an intranet, and/or the Internet.

Substrate 552 (or 652) can be affixed to the substrate holder 550 (or substrate holder 650) via a clamping system (not shown), such as a mechanical clamping system or an electrical clamping system (e.g., an electrostatic clamping system). Furthermore, substrate holder 550 (or 650) can include a heating system (not shown) or a cooling system (not shown) that is configured to adjust and/or control the temperature of substrate holder 550 (or 650) and substrate 552 (or 652).

Vacuum pumping systems 570A, 570B, and 570C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 750 may also include a vacuum pumping system. Furthermore, a device for monitoring chamber pressure (not shown) can be coupled to the vacuum vessel 502 or any of the three vacuum chambers 504, 506, 508. The pressure-measuring device can be, for example, a capacitance manometer or ionization gauge.

In other embodiments, gas GCIB processing systems 500, 600, 700 may include the secondary gas source (not shown) arranged to deliver a secondary gas into the processing system downstream of the exit 518 of the nozzle assembly 510. In another embodiment, the secondary gas source is arranged to deliver the secondary gas into the ionization/acceleration chamber 506 downstream of a skimmer 520. In another embodiment, the secondary gas source is arranged to deliver the secondary gas into the processing chamber 508 downstream of a final aperture. In another embodiment, any combination of the above described implementations of the secondary gas source may be used. Additional details concerning the design of a multiple gas cluster ion beam system are provided in U.S. Patent Application Publication No. 2016/0071734A1, entitled "Process Gas Enhancement for GCIB Treatment of a Substrate" and filed on Sep. 1, 2015.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for correcting a surface profile on a substrate, comprising:

receiving a substrate having a heterogeneous layer composed of a first material and a second material, wherein the heterogeneous layer has an initial upper surface exposing the first material and the second material, and defining a first surface profile across the substrate;

setting a target surface profile for the heterogeneous layer;

selectively removing at least a portion of the first material relative to the second material using a gas cluster ion beam (GCIB) etching process, and recessing the first material beneath the second material; and thereafter, selectively removing at least a portion of the second material relative to the first material to achieve a final upper surface exposing the first material and the second material, and defining a second surface profile, wherein the second surface profile is within a predetermined tolerance of the target surface profile.

2. The method of claim 1, wherein the first material is a dielectric material, and the second material is a semiconductive material or a conductive material.

3. The method of claim 1, wherein the first material is a silicon-containing material, and the second material is a metal-containing material.

4. The method of claim 1, wherein the first material is silicon oxide, silicon nitride, or mixtures thereof, or combinations thereof.

5. The method of claim 1, wherein the second material is selected from the group consisting of Si, Ge, C, In, Ga, As, P, Sb, W, Al, Ti, Ta, Co, Sc, Y, Zr, Hf, Nb, V, Cr, Mo, Mn, Re, Fe, Co, Rh, Ni, Pd, Pt, Cu, Ag, Au, Zn, Cd, B, Ga, In, and Sn.

6. The method of claim 1, wherein the heterogeneous layer is part of a replacement metal gate (RMG) structure.

7. The method of claim 1, wherein the first surface profile is a spatially non-uniform surface profile as a result of a chemical-mechanical polishing (CMP) process, and wherein the target surface profile for the heterogeneous layer is substantially planar.

8. The method of claim 1, wherein the GCIB etching process includes performing the following:

maintaining a reduced-pressure environment around a substrate holder for holding the substrate;

holding the substrate securely within the reduced-pressure environment;

forming a GCIB from a pressurized gas mixture containing a material suitable for etching the first material with selectivity relative to the second material;

accelerating the GCIB; and irradiating at least a portion of the GCIB onto at least a portion of the substrate.

9. The method of claim 8, wherein the pressurized gas mixture contains a halogen-containing gas, a halomethane, or a halosilane, or a combination of two or more thereof.

10. The method of claim 8, wherein the pressurized gas mixture includes $CF_4$, $NF_3$, $CHF_3$, or $SiF_4$, or any combination thereof.

11. The method of claim 8, wherein the pressurized gas mixture includes a noble gas element, $O_2$, or $N_2$, or both.

12. The method of claim 8, wherein the pressurized gas mixture contains one or more elements selected from the group consisting of B, C, H, Si, Ge, N, P, As, O, S, F, Cl, and Br.

13. The method of claim 1, wherein the GCIB etching process achieves an etch selectivity greater than or equal to 2, the etch selectivity being measured as the ratio of the etch rate of the first material to the etch rate of the second material when exposed to the GCIB etching process.

14. The method of claim 1, wherein the GCIB etching process achieves an etch selectivity greater than or equal to 5, the etch selectivity being measured as the ratio of the etch rate of the first material to the etch rate of the second material when exposed to the GCIB etching process.

15. The method of claim 1, wherein the selective removal of at least a portion of the second material relative to the first material includes performing a chemical-mechanical polishing (CMP) process.

16. The method of claim 1, further comprising:

collecting parametric data relating to the initial upper surface of the substrate; and spatially modulating an applied property of a GCIB used in the GCIB etching process, based at least in part on the parametric data, as a function of position on the heterogeneous layer of the substrate to recess the first material beneath the second material and achieve the second surface profile for the first material.

17. The method of claim 16, further comprising:

computing correction data using the first surface profile and the target surface profile.

18. The method of claim 16, wherein the applied property of the GCIB includes a beam dose.

19. The method of claim 16, wherein the applied property of the GCIB includes a beam area, a beam profile, a beam intensity, a beam scanning rate, or a dwell time, or any combination of two or more thereof.

20. A method for correcting a surface profile on a substrate, comprising:

receiving a substrate having a heterogeneous layer comprising a first dielectric material and a second gate electrode material selected from a conductive material or a semi-conductive material, wherein the heterogeneous layer has an initial upper surface exposing the first dielectric material and the second gate electrode material, and defining a spatially non-uniform surface profile across the substrate;

collecting parametric data relating to the initial upper surface of the substrate;

selectively removing at least a portion of the first dielectric material relative to the second gate electrode material using a gas cluster ion beam (GCIB) and spatially modulating an applied property of the GCIB, based at least in part on the parametric data, as a function of position on the heterogeneous layer of the substrate to recess the first dielectric material beneath the second gate electrode material; and thereafter, selectively removing at least a portion of the second gate electrode material relative to the first dielectric material to achieve a final upper surface exposing the first dielectric material and the second gate electrode material, and defining a second substantially uniform surface profile.

* * * * *